US009551927B2

(12) United States Patent
Yamaguchi et al.

(10) Patent No.: US 9,551,927 B2
(45) Date of Patent: Jan. 24, 2017

(54) PELLICLE FRAME AND PROCESS FOR PRODUCING SAME (71) Applicant: NIPPON LIGHT METAL COMPANY, LTD., Tokyo (JP)

(72) Inventors: Takayuki Yamaguchi, Shizuoka (JP); Yoshihiro Taguchi, Shizuoka (JP)

(73) Assignee: Nippon Light Metal Company, Ltd., Tokyo (JP)

( * ) Notice: Subject to any disclaimer, the term of this patent is extended or adjusted under 35 U.S.C. 154(b) by 0 days.

(21) Appl. No.: 15/026,901

(22) PCT Filed: Oct. 23, 2013

(86) PCT No.: PCT/JP2013/078672
§ 371 (c)(1),
(2) Date: Apr. 1, 2016

(87) PCT Pub. No.: WO2015/059783
PCT Pub. Date: Apr. 30, 2015

(65) Prior Publication Data
US 2016/0259239 A1  Sep. 8, 2016

(51) Int. Cl.
*G03F 1/64* (2012.01)
(52) U.S. Cl.
CPC ..................... *G03F 1/64* (2013.01)
(58) Field of Classification Search
CPC ........................................................ G03F 1/64
See application file for complete search history.

(56) References Cited

U.S. PATENT DOCUMENTS

| 2010/0273097 A1 | 10/2010 | Shirasaki |
| 2010/0328641 A1 | 12/2010 | Shirasaki et al. |
| 2010/0330466 A1 | 12/2010 | Shirasaki et al. |
| 2011/0081604 A1 | 4/2011 | Tsukada et al. |

FOREIGN PATENT DOCUMENTS

| JP | 2003-107678 A | 4/2003 |
| JP | 2011-76037 A | 4/2003 |
| JP | 2010-237282 A | 10/2010 |
| JP | 2011-7933 A | 1/2011 |
| JP | 2011-7934 A | 1/2011 |
| JP | 2010-256609 A | 11/2011 |
| JP | 2012-159671 A | 8/2012 |
| JP | 2013-7762 A | 1/2013 |
| JP | 2013-20235 A | 1/2013 |
| KR | 20-2012-005713 U | 8/2012 |

OTHER PUBLICATIONS

English translation of International Preliminary Report on Patentability and Written Opinion mailed May 6, 2016, in PCT International Application No. PCT/JP2013/078672.
International Search Report for PCT/JP2013/078672 mailed on Dec. 10, 2013.

*Primary Examiner* — Stewart Fraser
(74) *Attorney, Agent, or Firm* — Birch, Stewart, Kolasch & Birch, LLP (57) ABSTRACT

The present invention provides a pellicle frame that can prevent generation of haze and reduces a surface glittering defect under irradiation with collected light, and a method of manufacturing the pellicle frame. Specifically, provided are a pellicle frame, including: an aluminum frame material formed of aluminum or an aluminum alloy; and an anodic oxide film on a surface of the aluminum frame material, in which the anodic oxide film includes a film formed by using an alkaline anodic oxidation solution and a film formed by using an acid anodic oxidation solution, and a method of manufacturing the pellicle frame.

16 Claims, 1 Drawing Sheet

PELLICLE FRAME AND PROCESS FOR PRODUCING SAME

TECHNICAL FIELD

The present invention relates to a pellicle frame of a pellicle device to be used for, for example, transferring a circuit pattern of an IC or an LSI on a semiconductor substrate, and to a method of manufacturing the same. More particularly, the present invention relates to a pellicle frame that can prevent generation of haze and reduces a surface glittering defect under irradiation with collected light, and to a method of manufacturing the same.

BACKGROUND ART

A pellicle device is obtained by bonding a transparent optical thin film (pellicle film) to a pellicle frame having a shape corresponding to that of a photomask or a reticle, while expanding the film. The pellicle device prevents foreign materials from directly adhering onto the photomask or the reticle. In addition, even when the foreign materials adhere onto the pellicle film, such foreign materials do not form images on a semiconductor substrate or the like. Therefore, it is possible to accurately transfer a circuit pattern, and thus improve a manufacturing yield in a photolithography step.

In recent years, along with high integration of a semiconductor device or the like, a circuit pattern has been required to be drawn more finely with a smaller line width, and a mainstream exposure light source to be used in the photolithography step has employed a short-wavelength light. The light source employing such short-wavelength light has a high output power and high light energy. Therefore, when an inorganic acid, such as sulfuric acid, remains in an anodic oxide film on a surface of an aluminum frame material for forming the pellicle frame, there arises a problem in that such inorganic acid reacts with a basic substance, such as ammonia, which is present in an exposure atmosphere, to generate a reaction product, such as ammonium sulfate, and the reaction product causes fogging (haze) and affects a transferred image.

In view of the foregoing, there has been proposed a pellicle frame which is obtained by forming an anodic oxide film on the surface of an aluminum frame material through anodic oxidation treatment using an alkaline anodic oxidation solution containing, as an electrolyte, a salt of an organic acid, such as citric acid or tartaric acid, and thus reduced in the amount of the inorganic acid, such as sulfuric acid, and prevents the generation of haze as much as possible even under irradiation with high-energy light (see Patent Literatures 1 and 2).

Meanwhile, it is necessary to strictly control particles in a manufacturing process of the semiconductor device or the like, and also the pellicle device has generally been confirmed for the presence or absence of dust adhesion by visual observation or with an inspection device. However, in recent years, the thinning of the circuit pattern in the semiconductor device or the like has increasingly progressed, and along with this, inspection standards for the pellicle device have become stricter. Therefore, a white spot involving light reflection in visual inspection not only under irradiation with fluorescent light but also under irradiation with collected light, that is, a surface glittering defect of the pellicle frame (hereinafter sometimes referred to simply as "glittering" or the like) under irradiation with collected light is required to be reduced because such defect maybe falsely recognized as dust, or an incorrect pattern may be formed in the photolithography step when light from a light source is irregularly reflected owing to the glittering.

CITATION LIST

Patent Literature

[PTL 1] JP 2013-007762 A
[PTL 2] JP 2013-020235 A

SUMMARY OF INVENTION

Technical Problem

In such circumstances, there arises a new problem in that, in the case where the anodic oxide film is formed through the anodic oxidation treatment using an alkaline anodic oxidation solution containing, as an electrolyte, a salt of an organic acid, such as citric acid or tartaric acid, without using sulfuric acid in order to prevent the generation of haze, the surface glittering defect under irradiation with collected light is difficult to reduce, while the elution amounts of acid ions are small. The inventors of the present invention have diligently investigated the cause of the problem, and have found that an intermetallic compound in the aluminum frame material serving as a base material remains in the anodic oxide film in the anodic oxidation treatment, and the remaining intermetallic compound glitters under irradiation with collected light.

In view of the foregoing, the inventors of the present invention have made further investigations on reducing such glittering while reducing the elution amounts of acid ions, which cause haze. As a result, the inventors have found that, when anodic oxidation treatment using an acid anodic oxidation solution in which the intermetallic compound is soluble is performed in addition to the anodic oxidation treatment using an alkaline anodic oxidation solution, the amount of the intermetallic compound remaining in the formed anodic oxide film is reduced, and thus the glittering under irradiation with collected light resulting from the intermetallic compound can be reduced. Thus, the present invention has been completed.

Accordingly, an object of the present invention is to provide a pellicle frame that can prevent generation of haze and reduces a surface glittering defect under irradiation with collected light.

In addition, another object of the present invention is to provide a method of manufacturing a pellicle frame that can prevent generation of haze and reduce a surface glittering defect under irradiation with collected light.

Solution to Problem

That is, according to one embodiment of the present invention, there is provided a pellicle frame, including: an aluminum frame material formed of aluminum or an aluminum alloy; and an anodic oxide film on a surface of the aluminum frame material, in which the anodic oxide film includes a film formed by using an alkaline anodic oxidation solution and a film formed by using an acid anodic oxidation solution.

According to another embodiment of the present invention, there is provided a method of manufacturing a pellicle frame including: an aluminum frame material formed of aluminum or an aluminum alloy; and an anodic oxide film on a surface of the aluminum frame material, the method including the steps of, when forming the anodic oxide film: performing anodic oxidation treatment using an alkaline anodic oxidation solution; and performing anodic oxidation treatment using an acid anodic oxidation solution.

In the present invention, it is preferred that an Al—Zn—Mg-based aluminum alloy be used for the aluminum frame material formed of aluminum or an aluminum alloy for forming the pellicle frame. The Al—Zn—Mg-based aluminum alloy is suitable for obtaining the pellicle frame, for example, because the Al—Zn—Mg-based aluminum alloy has the highest strength among aluminum alloys, realizes high dimensional accuracy, and can be prevented from being deformed by external force or flawed during its use. The aluminum alloy preferably contains, as chemical components of the balance other than Al, 5.1 mass % to 6.1 mass % of Zn, 2.1 mass % to 2.9 mass % of Mg, and 1.2 mass % to 2.0 mass % of Cu. The aluminum alloy may further contain Fe, Si, Mn, V, Zr, and any other elements as impurities, as well as Cr, Ti, and B. As a typical example of such preferred aluminum alloy, A7075 specified by JIS is given.

The pellicle frame is generally manufactured by subjecting an ingot having a predetermined chemical composition to extrusion, rolling processing, or the like, followed by solution treatment and subsequent artificial aging hardening treatment to allow aging precipitation of a compound containing alloy elements and thereby provide strength, and then processing into an aluminum frame having a frame shape. Also in the present invention, the strength of the pellicle frame can be further improved through the use of an aluminum alloy obtained by subjecting preferably an Al—Zn—Mg-based aluminum alloy to solution treatment and then aging treatment. As treatment for such aging precipitation, there are given, for example, treatment such as T4, T6, T7, and T651, and a T6 tempered material is preferably used. It should be noted that the aging treatment for obtaining the aluminum material subjected to aging treatment conforms to the tempering conditions described in JIS H0001. Further, the aluminum alloy subjected to aging precipitation as described above may be subjected to annealing treatment as required.

After the aluminum frame material is prepared as described above, anodic oxidation treatment is performed thereon to form the anodic oxide film on the surface of the aluminum frame material. As described above, in the present invention, it has been found out that, in the case of performing the anodic oxidation treatment using an alkaline anodic oxidation solution without using sulfuric acid, which is a substance causing haze, an intermetallic compound in the aluminum frame material remains in the anodic oxide film and results in the glittering. Therefore, there is performed anodic oxidation treatment using the acid anodic oxidation solution in which the intermetallic compound is soluble, and thus the anodic oxide film reduced in the intermetallic compound, which results in the glittering, is formed.

Herein, examples of the intermetallic compound, which results in the glittering, include an Al—Cu—Mg-based crystallized product, an Al—Fe—Cu-based crystallized product, and a $Mg_2Si$ crystallized product in the aluminum frame material formed of the Al—Zn—Mg-based aluminum alloy. As shown in Examples described later, it has been confirmed that, of such intermetallic compounds, an intermetallic compound having a maximum length of 5 μm or more glitters in visual observation under irradiation with collected light. Therefore, at the time of forming the anodic oxide film by using the acid anodic oxidation solution, the anodic oxidation treatment is preferably performed so that the intermetallic compound has a maximum length of less than 5 μm. It should be noted that the intermetallic compound may be confirmed with a scanning electron microscope (SEM) or the like, and its maximum length may be determined through observation of the surface of the anodic oxide film. In addition, as a method of specifying the cause for the glittering, there is given a method involving observing a glittering portion with a microscope and marking around the glittering portion, followed by observation of the glittering portion by SEM and component analysis of the portion with an energy dispersive X-ray analyzer (EDAX, manufactured by Horiba, Ltd.). Thus, the presence of the intermetallic compound, such as the Al—Fe—Cu-based crystallized product, the Al—Cu—Mg-based crystallized product, or the $Mg_2Si$ crystallized product, can be confirmed.

As the acid anodic oxidation solution in which such intermetallic compound is soluble, there maybe suitably used, for example: an acid solution containing an organic acid having a carboxyl group and not containing S (sulfur component), such as maleic acid or oxalic acid; or an acid solution containing an inorganic acid, such as phosphoric acid, chromic acid, or a mixture thereof. Through anodic oxidation treatment using those acid anodic oxidation solutions, the intermetallic compound as described above is dissolved, and thus the anodic oxide film can be reduced in the intermetallic compound. Incidentally, with regard to the $Mg_2Si$ crystallized product, Mg is dissolved, but a Si component may remain (remain as $SiO_2$) in the anodic oxide film without being dissolved even through use of the acid anodic oxidation solution. However, the remaining Si component does not result in the glittering because the Si component has a significantly small size of 5 μm or less at a maximum.

In the present invention, the conditions of the anodic oxidation treatment using the acid anodic oxidation solution vary depending on the kind of an acid to be used, and hence it is difficult to specify the conditions in a word. However, for example, in the case of using maleic acid as the organic acid, the conditions are as described below. Specifically, the concentration of maleic acid is desirably from 5 wt % to 70 wt %, preferably from 10 wt % to 20 wt %. This is because, when the concentration is less than 5 wt %, a current is difficult to flow at a voltage at which coloration is permitted, and hence it takes an excessively long time to obtain an intended film thickness, with the result that the formed film is dissolved. This is also because, in contrast, when the concentration exceeds 70 wt %, deposition occurs. In addition, a pH is desirably 1.5 or less, preferably 1 or less. This is because, when the pH exceeds 1.5, electrolysis takes a long time owing to a low concentration, and it is difficult to generate the film. In addition, a solution temperature is set to desirably from 25° C. to 90° C., preferably from 50° C. to 60° C. This is because, when the solution temperature is less than 25° C., a current is difficult to flow at a voltage at which the coloration is permitted, and hence it is difficult to generate the film. This is also because, in contrast, when the solution temperature exceeds 90° C., an evaporation amount from the anodic oxidation solution increases, which leads to intense mist scattering, a poor operation environment, or difficult control of the concentration of the solution. In addition, a voltage is set to desirably from 50 V to 150 V, preferably 100 V or less. This is because, when the voltage is less than 50 V, a current is difficult to flow, and hence it is difficult to generate the film. In addition, a time period of the electrolysis required in this case is desirably from 5 min to 30 min, preferably from 10 min to 20 min.

In addition, in the case of using phosphoric acid as the acid anodic oxidation solution, the conditions are as described below. Specifically, the concentration of phosphoric acid is desirably from 1 wt % to 30 wt %, preferably from 5 wt % to 25 wt %. This is because, when the concentration is less than 1 wt %, a current is difficult to flow at a voltage at which the coloration is permitted, and hence it is difficult to generate the film. This is also because, in contrast, when the concentration exceeds 30 wt %, performance changes little as compared to the case of a concentration of 30 wt %, and chemical cost increases. In addition, a pH is desirably 1.5 or less, preferably 1 or less. This is because, when the pH exceeds 1.5, it is difficult to generate the film at a voltage at which the coloration is permitted owing to a low concentration.

In addition, a solution temperature is set to desirably from 5° C. to 30° C., preferably from 10° C. to 25° C. This is because, when the solution temperature is less than 5° C., a current does not flow at a voltage at which the coloration is permitted, and hence it is difficult to generate the film. This is also because, in contrast, when the solution temperature exceeds 30° C., the dissolution of the film proceeds. In addition, a voltage is set to desirably from 5 V to 30 V, preferably from 10 V to 25 V. In addition, a time period of the electrolysis required in this case is desirably from 3 min to 30 min, preferably from 5 min to 20 min.

Meanwhile, as the alkaline anodic oxidation solution, it is suitable to: i) perform anodic oxidation treatment using an inorganic alkaline solution containing, for example, any one or more kinds of inorganic alkaline components selected from the group consisting of sodium hydroxide, potassium hydroxide, lithium hydroxide, calcium hydroxide, strontium hydroxide, rubidium hydroxide, sodium carbonate, and sodium hydrogen carbonate; or ii) use an alkaline mixed solution containing, for example, salts of organic acids containing a carboxyl group, such as tartaric acid, citric acid, oxalic acid, and salicylic acid and any one or more kinds of inorganic alkaline components selected from the group consisting of sodium hydroxide, potassium hydroxide, lithium hydroxide, calcium hydroxide, strontium hydroxide, rubidium hydroxide, sodium carbonate, and sodium hydrogen carbonate. In the related-art pellicle frames, a pellicle frame using a sulfuric acid as an electrolyte can be used, because a pattern circuit to be required is not so fine and irradiation light does not have high energy in the case of using long-wavelength irradiation light, such as i line and g line . However, in recent years, in the case of using an exposure light source of a shorter wavelength having higher energy, an organic dye used for blackening may be decomposed to cause color fading or the inorganic acid trapped in the anodic oxide film may generate haze. Therefore, in the present invention, the anodic oxide film is formed by using an alkaline anodic oxidation solution, such as the ones according to the above-mentioned items i) and ii).

Now, the case of using as the alkaline solution the inorganic alkaline solution containing an inorganic alkaline component according to the above-mentioned item i) is first described. In this case, it is preferred to use sodium hydroxide or potassium hydroxide from the viewpoint of versatility. In those cases, the concentration of the inorganic alkali is desirably from 0.2 wt % to 10 wt %, preferably from 0.4 wt % to 5 wt %. When the concentration of the inorganic alkali is less than 0.2 wt %, a current is difficult to flow in a voltage range in which the coloration is permitted, and hence it takes a long time to generate the film. In contrast, when the concentration of the inorganic alkali exceeds 10 wt %, the dissolution of the generated anodic oxide film proceeds. In addition, the pH of the anodic oxidation solution in this case is desirably from 12 to 14, preferably from 12.5 to 13.0. When the pH is less than 12, the generation speed of the film is reduced in some cases.

In addition, in the case of using the alkaline mixed solution containing a salt of an organic acid and an inorganic alkaline component according to the above-mentioned item ii, for example, a citrate such as sodium citrate, potassium citrate, lithium citrate, or ammonium citrate may be suitably used as a citrate. The concentration of the citrate is desirably from 2 wt % to 30 wt %, preferably from 5 wt % to 20 wt % . When the concentration of the citrate is less than 2 wt %, it is difficult to form the anodic oxide film. In contrast, when the concentration of the citrate exceeds 30 wt %, there is a risk in that the citrate deposits during anodic oxidation at low temperature. In addition, the pH of the alkaline solution (alkaline mixed solution) containing the citrate and the inorganic alkaline component is desirably from 12 to 14, preferably from 12.5 to 13.0. When the pH is less than 12, the generation speed of the film is reduced in some cases.

In addition, a tartrate such as sodium tartrate, potassium tartrate, sodium potassium tartrate, or ammonium tartrate maybe suitably used as a tartrate . The concentration of the tartrate is desirably from 1.3 wt % to 20 wt %, preferably from 2.5 wt % to 15 wt %. The pH of the alkaline solution (alkaline mixed solution) containing the tartrate and the inorganic alkaline component is desirably from 12 to 14, preferably from 12.5 to 13.0. In addition, an oxalate such as sodium oxalate, potassium oxalate, or ammonium oxalate may be suitably used as an oxalate. The concentration of the oxalate is desirably from 0.3 wt % to 35 wt %, preferably from 1 wt % to 30 wt %. The pH of the alkaline solution (alkaline mixed solution) containing the oxalate and the inorganic alkaline component is desirably from 12 to 14, preferably from 12.5 to 13.5. Further, a salicylate such as sodium salicylate, potassium salicylate, lithium salicylate, or ammonium salicylate may be suitably used as a salicylate. The concentration of the salicylate is desirably from 0.1 wt % to 50 wt %, preferably from 3 wt % to 40 wt %. The pH of the alkaline solution (alkaline mixed solution) containing the salicylate and the inorganic alkaline component is desirably from 12 to 14, preferably from 12.5 to 13.5.

As the conditions of anodic oxidation, treatment conditions of the anodic oxidation treatment using the inorganic alkaline solution according to the above-mentioned item i) are as follows: a voltage is desirably from 2 V to 60 V, preferably from 5 V to 50 V. This is because, when the voltage is less than 2 V, a current is difficult to flow, and hence a time period of the electrolysis required for obtaining an intended film thickness is prolonged, with the result that the film is dissolved. This is also because, in contrast, when the voltage exceeds 60 V, the number of pores per area is reduced, and hence the coloration becomes difficult. In addition, in the case of using the alkaline mixed solution containinga salt of an organic acid and an inorganic alkaline component according to the above-mentioned item ii), the voltage is from 2 V to 60 V, preferably from 5 V to 50 V in the case of the alkaline mixed solution containing the citrate and the inorganic alkaline component. In addition, the voltage is from 2 V to 60 V, preferably from 5 V to 50 V in the case of the alkaline mixed solution containing the tartrate and the inorganic alkaline component. The voltage is from 2 V to 60 V, preferably from 5 V to 50 V in the case of the alkaline mixed solution containing the oxalate and the inorganic alkaline component. Further, the voltage is from 2 V to 60 V, preferably from 5 V to 50 V in the case of the alkaline mixed solution containing the salicylate and the inorganic alkaline component.

In addition, an electrical quantity during the anodic oxidation treatment desirably ranges from 3 C/cm² to 50 C/cm², preferably from 5 C/cm² to 30 C/cm² in the case of using the inorganic alkaline solution according to the above-mentioned item i). In addition, in the case of using the alkaline mixed solution containing a salt of an organic acid and an inorganic alkaline component according to the above-mentioned item ii), the electrical quantity desirably ranges from 3 C/cm² to 50 C/cm², preferably from 5 C/cm² to 30 C/cm² in the case of the alkaline mixed solution containing the citrate and the inorganic alkaline component. In addition, the electrical quantity desirably ranges from 3 C/cm² to 50 C/cm², preferably from 5 C/cm² to 30 C/cm² in the case of the alkaline mixed solution containing the tartrate and the inorganic alkaline component. The electrical quantity desirably ranges from 3 C/cm² to 50 C/cm², preferably from 5 C/cm² to 30 C/cm² in the case of the alkaline mixed solution containing the oxalate and the inorganic alkaline component. The electrical quantity desirably ranges from 5 C/cm² to 70 C/cm², preferably from 7 C/cm² to 50 C/cm² in the case of the alkaline mixed solution containing the salicylate and the inorganic alkaline component.

In addition, in the anodic oxidation treatment using the alkaline anodic oxidation solution, the solution temperature is set to desirably from 0° C. to 20° C., preferably from 0° C. to 15° C., more preferably from 5° C. to 10° C. in both the cases of using the inorganic alkaline solution according to the above-mentioned item i) and using the alkaline mixed solution containing a salt of an organic acid and an inorganic alkaline component according to the above-mentioned item ii) When the solution temperature is less than 0° C., the generation speed of the film is reduced and the treatment becomes inefficient. In contrast, when the solution temperature exceeds 20° C., the dissolution speed of the film is increased to prolong the time period for forming the film, and dusting or the like may occur.

The film thickness of the anodic oxide film to be formed in the present invention is desirably from 2 µm to 10 µm, preferably from 3 µm to 8 µm in total in the case of performing the anodic oxidation treatment using the alkaline anodic oxidation solution and then anodic oxidation treatment using phosphoric acid. Of the film thicknesses, the film thickness of a film obtained through the anodic oxidation treatment using the alkaline anodic oxidation solution is desirably from 1.5 µm to 9.5 µm, preferably from 2 µm to 5 µm. In addition, the film thickness of a film obtained through the anodic oxidation treatment using phosphoric acid is desirably from 0.5 µm to 3 µm, preferably from 1 µm to 2 µm.

In contrast, the film thickness of the film obtained in the case of performing anodic oxidation treatment using maleic acid and then the anodic oxidation treatment using the alkaline anodic oxidation solution is desirably from 1 µm to 10 µm, preferably from 2 µm to 8 µm in total. Of the film thicknesses, the film thickness of a film obtained through the anodic oxidation treatment using the alkaline anodic oxidation solution is desirably from 1.5 µm to 9.5 µm, preferably from 2 µm to 5 µm. In addition, the film thickness of a film obtained through the anodic oxidation treatment using maleic acid is desirably from 0.5 µm to 2 µm, preferably from 1 µm to 1.5 µm.

In the present invention, the method of manufacturing a pellicle frame only needs to include the steps of, when forming the anodic oxide film: performing anodic oxidation treatment using an acid anodic oxidation solution; and performing anodic oxidation treatment using an alkaline anodic oxidation solution. The order of the steps is not limited. Specifically, it is appropriate to first perform the anodic oxidation treatment using an alkaline anodic oxidation solution and then the anodic oxidation treatment using an acid anodic oxidation solution, to reduce the amount of the intermetallic compound in the anodic oxide film through dissolution. According to a procedure inverse to the above-mentioned procedure, it is also appropriate to first perform the anodic oxidation treatment using an acid anodic oxidation solution and then the anodic oxidation treatment using an alkaline anodic oxidation solution. In addition, a barrier layer to be formed through the anodic oxidation treatments may affect subsequent blackening of the film (in particular, in the case of electrolytic deposition treatment) depending on the kind of the acid anodic oxidation solution. Therefore, the anodic oxidation treatment using an alkaline anodic oxidation solution may also be further performed after the above-mentioned anodic oxidation treatments.

As described above, after the anodic oxide film is formed by using the acid and alkaline anodic oxidation solutions, the anodic oxide film is desirably blackened for the purposes of, for example, preventing scattering of exposure light and facilitating a foreign material adhesion test before use. For blackening treatment, any known method may be employed, and examples of the treatment include dyeing treatment with a black dye and electrolytic deposition treatment.

For example, in the dyeing treatment with a black dye, it is preferred to use an organic black dye. In general, an organic dye containing as acid components sulfuric acid, acetic acid, and formic acid at small contents is most suitably used. As such organic dye, there maybe given, for example, commercially available products "TAC411", "TAC413", "TAC415", and "TAC420" (all the products are manufactured by Okuno Chemical Industries Co., Ltd.). It is desired that the aluminum frame material after the anodic oxidation treatment be immersed in a dye solution prepared to achieve a predetermined concentration, and subjected to dyeing treatment under the treatment conditions of a treatment temperature of from 40° C. to 60° C. and a pH of from 5 to 6 for about 10 min.

In addition, in the electrolytic deposition treatment, a support frame is colored in black by depositing one kind or two or more kinds of metals selected from the group consisting of Ni, Co, Cu, Sn, Mn, and Fe (hereinafter sometimes referred to as "electrolytic coloration"). Those metals may be used in the form of a metal salt, an oxide, colloidal particles, or the like, but it is desired to use an electrolytic deposition solution having added thereto one kind or two or more kinds selected from the group consisting of a Ni salt, a Co salt, a Cu salt, a Sn salt, a Mn salt, and an Fe salt. More suitable examples thereof include an electrolytic deposition solution containing nickel sulfate and boric acid and an electrolytic deposition solution containing nickel acetate and boric acid. In addition, the electrolytic deposition solution may contain tartaric acid, magnesium oxide, acetic acid, or the like for the purpose of, for example, preventing deposition of eluted aluminum or adjusting a pH. In addition, the anodic oxide film can be colored in black through the electrolytic deposition treatment under the conditions of a solution temperature of from about 15° C. to about 40° C., a voltage of from about 10 V to about 30 V, and a time period of from about 1 min to about 20 min. In addition, in the electrolytic deposition treatment, a voltage may be applied by a direct current power source or an alternate current power source, and preliminary electrolysis may be performed at the beginning.

Moreover, when the dyeing treatment with a black dye, the electrolytic deposition treatment, or the like is performed as described above, a sufficiently blackened anodic oxide film having a lightness index L* value based on the Hunter's color difference formula or JIS Z8722-2009 of 40 or less, suitably of 35 or less can be obtained.

It should be noted that, in the present invention, the surface of the aluminum material may be subjected to roughening treatment by mechanical means, such as blast processing, or by chemical means using an etching solution, prior to the anodic oxidation treatments. A low reflective black support frame like a matted one can be obtained by preliminarily performing such roughening treatment and then performing the anodic oxidation treatments.

After the anodic oxide film is blackened, the anodic oxide film may be subjected to sealing treatment. The conditions of the sealing treatment are not particularly limited, and any known method, such as one using steam or a sealing solution, may be adopted. Of those, sealing treatment using steam is desired from the viewpoint of sealing an acid component while eliminating a risk of contamination with impurities. Desired conditions of the sealing treatment using steam may be, for example, as follows: a temperature of from 105° C. to 130° C.; a relative humidity of from 90% (R.H.) to 100% (R.H.); a pressure of from 0.4 kg/cm$^2$G to 2.0 kg/cm$^2$G; and a treatment time period of from 12 min to 60 min. It should be noted that, after the sealing treatment, for example, washing with pure water is desirably performed.

In addition, the pellicle frame obtained by the present invention has the following concentrations of ions to be eluted in 100 ml of pure water per 100 cm$^2$ of the surface area of the pellicle frame in an ion elution test for measuring the concentrations of ions eluted after immersion in pure water at 80° C. for 4 hours: 0.2 ppm or less, preferably 0.1 ppm or less, more preferably less than 0.08 ppm, still more preferably 0.05 ppm or less for an acetate ion ($CH_3COO^-$); 0.06 ppm or less, preferably 0.05 ppm or less, more preferably less than 0.03 ppm for a formate ion ($HCOO^-$); 0.01 ppm or less, preferably less than 0.005 ppm for an oxalate ion ($C_2O_4^{2-}$); 0.01 ppm or less, preferably less than 0.005 ppm for a sulfate ion ($SO_4^{2-}$); 0.02 ppm or less, preferably 0.01 ppm or less for a nitrate ion ($NO_3^-$); 0.02 ppm or less, preferably 0.01 ppm or less for a nitrite ion ($NO_2^-$) 0.02 ppm or less, preferably 0.01 ppm or less for a chlorine ion ($Cl^-$); and 0.01 ppm or less, preferably less than 0.01 ppm for a phosphonate ion ($PO_4^{3-}$). It should be noted that the detection of the ions to be eluted may be performed by ion chromatography analysis. The detailed measurement conditions are described in Examples.

Those ions affect the generation of haze. Of those ions, the elution amounts of an acetate ion, a formate ion, a sulfate ion, an oxalate ion, and a nitrite ion can be controlled to provide a pellicle frame achieving as much reduction in haze as possible.

The pellicle frame obtained by the present invention can be used as a pellicle after an optical thin film is bonded on one surface thereof. The optical thin film is not particularly limited, and any known optical film may be used. Examples thereof may include: inorganic substances, such as quartz; and polymers, such as nitrocellulose, polyethylene terephthalate, cellulose esters, polycarbonate, and polymethyl methacrylate. In addition, the optical thin film may include an antireflection film containing an inorganic substance, such as $CaF_2$, or a polymer, such as polystyrene and Teflon (trademark).

In addition, a pressure-sensitive adhesive body for fixing the pellicle onto a photomask or a reticle is provided on the end surface of the support frame opposite to the surface on which the optical thin film is provided. A pressure-sensitive adhesive material alone or a material obtained by applying the pressure-sensitive adhesive material onto both the surfaces of an elastic base may be used as the pressure-sensitive adhesive body. Herein, examples of the pressure-sensitive adhesive material may include adhesive agents such as an acryl-based one, a rubber-based one, a vinyl-based one, an epoxy-based one, and a silicone-based one. In addition, as a highly elastic material to serve as the base, a rubber and foam are given. Examples thereof may include, but not particularly limited to, a butyl rubber, polyurethane foam, and polyethylene foam.

Advantageous Effects of Invention

According to the present invention, the amount of the intermetallic compound in the aluminum frame material is reduced through the anodic oxidation treatments using the alkaline anodic oxidation solution and the acid anodic oxidation solution, and thus the pellicle frame reduced in the surface glittering defect under irradiation with collected light can be obtained. With this, a situation in which the surface glittering defect under irradiation with collected light is falsely recognized as dust can be prevented. In addition, the obtained pellicle frame has a small content of an acid component, and hence can prevent the generation of haze as much as possible. In addition, the pellicle frame obtained by the present invention has high dimensional accuracy, is less liable to be flawed, has excellent durability, and is less liable to emit dust . Therefore, when used as a pellicle, such pellicle is suitable for photolithography through exposure with high-energy light, such as a KrF excimer laser, an ArF excimer laser, a $F_2$ excimer laser, or the like, and can be reliably used over a long period of time.

BRIEF DESCRIPTION OF DRAWINGS

[(i): an anodic oxide film formed by using, as an anodic oxidation solution, an alkaline mixed solution containing sodium citrate and sodium hydroxide.

(ii): an anodic oxide film formed by using, as an anodic oxidation solution, phosphoric acid.]

DESCRIPTION OF EMBODIMENTS

Preferred embodiments of the present invention are hereinafter described on the basis of Examples and Comparative Examples.

EXAMPLES

[Confirmation Test of Reduction in Glittering through Anodic Oxidation Treatment]

Test Examples 1-1 to 1-8

For confirming a reducing effect on glittering through anodic oxidation treatment, the following test was performed. Hollow extrusion materials each formed of a JIS A7075 aluminum alloy treated to serve as a material of temper designation T6 specified in JIS H0001 (JIS A7075-T6) were each cut and processed into a frame shape having support frame external dimensions of 160 mm×130 mm×5 mm in height and a support frame thickness of 3 mm through grinding and polishing. Thus, aluminum frames were prepared. In the case where electrolytic deposition treatment was performed in subsequent blackening or where coloration treatment was not performed (hereinafter sometimes referred to simply as "integral coloration"), the aluminum frame materials were each annealed at a heat treatment temperature of 250° C. for a time period of heat treatment of 60 min in the atmosphere. Then, the surfaces of the aluminum frame materials were each subjected to shot blasting treatment using stainless steel having an average diameter of about 100 μm.

Next, the resultant aluminum frame materials were each subjected to anodic oxidation treatment (anodic oxidation treatment in the first step) using, as an anodic oxidation solution, an alkaline aqueous solution (pH=14) in which 10 wt % of sodium hydroxide (NaOH) was dissolved at a solution temperature of 10° C. and an electrolysis voltage of 20 V for 30 min.

Next, the aluminum frame materials were each subjected to anodic oxidation treatment (anodic oxidation treatment in the second step) using, as an electrolytic solution, an acid aqueous solution (pH=1) in which phosphoric acid ($H_3PO_4$) was dissolved under the conditions shown in Examples 1-1 to 1-8 of Table 1. After that, of the aluminum frame materials each subjected to the anodic oxidation treatments, the ones not subjected to the annealing treatment were subjected to dyeing treatment by being put in an aqueous solution containing an organic dye (TAC 411 manufactured by Okuno Chemical Industries Co., Ltd.) at a concentration of 1 wt % and immersed therein at a temperature of 55° C. for 10 min. In addition, the aluminum frame materials previously subjected to the annealing treatment were subjected to, as electrolytic deposition treatment, electrolysis using an electrolytic deposition solution (pH=5) in which 10 wt % of a nickel (Ni) acetate aqueous solution, 4 wt % of boric acid, and 0.3 wt % of tartaric acid were dissolved at a solution temperature of 30° C. and an alternate current voltage of 15 V for 10 min, and thus blackened through the electrolytic deposition treatment.

After that, the aluminum frame materials were each subjected to sealing treatment for 30 min while steam having a relative humidity of 1000 (R.H.), a pressure of 2.0 kg/cm$^2$G, and a temperature of 130° C. was generated in a steam sealing apparatus. Thus, pellicle frames according to Test Examples 1-1 to 1-8 were obtained. The obtained pellicle frames were each evaluated for glittering and blackness, and subjected to an elution test of various ions as described below. The results are shown in Table 1.

TABLE 1

| | Anodic oxidation treatment in first step | | | | | Anodic oxidation treatment in second step | | | | | Anodic oxidation treatment in third step | | | | | | Outer appearance | | Elution test | Remark |
|---|---|---|---|---|---|---|---|---|---|---|---|---|---|---|---|---|---|---|---|---|
| | Electrolytic solution | Concentration (wt %) | Solution temperature (° C.) | Voltage (V) | Time (min) | Electrolytic solution | Concentration (wt %) | Solution temperature (° C.) | Voltage (V) | Time (min) | Electrolytic solution | Concentration (wt %) | Solution temperature (° C.) | Voltage (V) | Time (min) | Coloration method | Glittering | Blackness | | |
| Test Example 1-1 | NaOH | 10 | 10 | 20 | 30 | Phosphoric acid | 5 | 5 | 20 | 5 | | | | | | Dyeing | ○ | ○ | ○ | Corresponding to Example |
| Test Example 1-2 | | | | | | | 5 | 25 | 20 | 5 | | | | | | | ○ | ○ | ○ | Corresponding to Example |
| Test Example 1-3 | | | | | | | 5 | 25 | 20 | 10 | | | | | | | ○ | ○ | ○ | Corresponding to Example |
| Test Example 1-4 | | | | | | | 10 | 25 | 20 | 10 | | | | | | | ○ | ○ | ○ | Corresponding to Example |
| Test Example 1-5 | | | | | | | 5 | 5 | 20 | 5 | | | | | | Electrolytic coloration | ○ | ○ | ○ | Corresponding to Example |
| Test Example 1-6 | | | | | | | 5 | 25 | 20 | 5 | | | | | | | ○ | ○ | ○ | Corresponding to Example |
| Test Example 1-7 | | | | | | | 5 | 25 | 20 | 10 | | | | | | | ○ | ○ | ○ | Corresponding to Example |
| Test Example 1-8 | | | | | | | 10 | 25 | 20 | 10 | | | | | | | ○ | ○ | ○ | Corresponding to Example |
| Test Example 1-9 | NaOH | 10 | 10 | 20 | 30 | Maleic acid | 5 | 25 | 50 | 5 | NaOH | 10 | 10 | 20 | 3 | Dyeing | ○ | ○ | ○ | Corresponding to Example |
| Test Example 1-10 | | | | | | | 5 | 50 | 50 | 5 | | | | | | | ○ | ○ | ○ | Corresponding to Example |
| Test Example 1-11 | | | | | | | 5 | 90 | 100 | 10 | | | | | | | ○ | ○ | ○ | Corresponding to Example |
| Test Example 1-12 | | | | | | | 5 | 90 | 100 | 10 | | | | | | | ○ | ○ | ○ | Corresponding to Example |
| Test Example 1-13 | | | | | | | 5 | 25 | 100 | 5 | | | | | | Electrolytic coloration | ○ | ○ | ○ | Corresponding to Example |
| Test Example 1-14 | | | | | | | 5 | 50 | 100 | 5 | | | | | | | ○ | ○ | ○ | Corresponding to Example |
| Test Example 1-15 | | | | | | | 5 | 90 | 100 | 10 | | | | | | | ○ | ○ | ○ | Corresponding to Example |
| Test Example 1-16 | | | | | | | 20 | 90 | 100 | 10 | | | | | | | ○ | ○ | ○ | Corresponding to Example |
| Test Example 1-17 | Maleic acid | 10 | 50 | 50 | 10 | NaOH | 10 | 10 | 20 | 5 | | | | | | Electrolytic coloration | ○ | ○ | ○ | Corresponding to Example |
| Test Example 1-18 | | 10 | 90 | 50 | 10 | | 10 | 10 | 20 | 5 | | | | | | | ○ | ○ | ○ | Corresponding to Example |
| Test Example 1-19 | | 10 | 90 | 100 | 10 | | 10 | 10 | 20 | 5 | | | | | | | ○ | ○ | ○ | Corresponding to Example |
| Test Example 1-20 | | 20 | 90 | 100 | 10 | | 10 | 10 | 20 | 5 | | | | | | | ○ | ○ | ○ | Corresponding to Example |
| Test Example 1-21 | | 20 | 90 | 100 | 20 | | 10 | 10 | 20 | 5 | | | | | | | ○ | ○ | ○ | Corresponding to Example |

TABLE 1-continued

| | Anodic oxidation treatment in first step | | | | | | Anodic oxidation treatment in second step | | | | | | Anodic oxidation treatment in third step | | | | | | Outer appearance | | Elution | |
|---|---|---|---|---|---|---|---|---|---|---|---|---|---|---|---|---|---|---|---|---|---|---|
| | Electrolytic solution | Concentration (wt %) | Solution temperature (° C.) | Voltage (V) | Time (min) | Electrolytic solution | Concentration (wt %) | Solution temperature (° C.) | Voltage (V) | Time (min) | Electrolytic solution | Concentration (wt %) | Solution temperature (° C.) | Voltage (V) | Time (min) | Coloration method | Glittering | Blackness | test | Remark |
| Test Example 1-22 | Phosphoric acid | 20 | 90 | 100 | 20 | | 10 | 10 | 20 | 30 | | | | | | | Δ | ○ | ○ | Corresponding to Example |
| Test Example 1-23 | Phosphoric acid | 5 | 5 | 20 | 5 | NaOH | 10 | 10 | 20 | 5 | | | | | | | ○ | ○ | ○ | Corresponding to Example |
| Test Example 1-24 | Phosphoric acid | 5 | 25 | 20 | 5 | | 10 | 10 | 20 | 5 | | | | | | | ○ | ○ | ○ | Corresponding to Example |
| Test Example 1-25 | Phosphoric acid | 5 | 25 | 20 | 10 | | 10 | 10 | 20 | 5 | | | | | | | ○ | ○ | ○ | Corresponding to Example |
| Test Example 1-26 | Phosphoric acid | 10 | 25 | 20 | 10 | | 10 | 10 | 20 | 5 | | | | | | | ○ | ○ | ○ | Corresponding to Example |
| Test Example 1-27 | Phosphoric acid | 10 | 25 | 20 | 10 | | 10 | 10 | 20 | 30 | | | | | | | Δ | ○ | ○ | Corresponding to Example |
| Test Example 1-28 | Maleic acid | 10 | 90 | 50 | 10 | NaOH | 10 | 10 | 20 | 5 | | | | | | Integral coloration | ○ | ○ | ○ | Corresponding to Example |
| Test Example 1-29 | Phosphoric acid | 5 | 25 | 20 | 10 | | 10 | 10 | 20 | 5 | | | | | | | ○ | ○ | ○ | Corresponding to Example |
| Test Example 1-30 | NaOH | 10 | 10 | 20 | 30 | | | | | | | | | | | Dyeing | × | ○ | ○ | Corresponding to Comparative Example |
| Test Example 1-31 | | 10 | 10 | 20 | 30 | | | | | | | | | | | Electrolytic coloration | × | ○ | ○ | Corresponding to Comparative Example |

[Description of Glittering]

The glittering was confirmed as described below. Specifically, all the surfaces (inner surface, outer surface, and all end surfaces) of each pellicle frame obtained were visually observed under irradiation with collected light at an illuminance of 300,000 lux (lx) while the angle of the pellicle frame was changed. Thus, each pellicle frame was confirmed as to whether or not a white spot involving light reflection was generated, and judged as described below.

○: The case where no spot glittering finely and minutely is present on any of the surfaces of the one pellicle frame.

Δ: The case where five or less spots glittering finely and minutely are present on all the surfaces of the one pellicle frame.

×: The case where five or more spots glittering finely and minutely are present on all the surfaces of the one pellicle frame.

[Description of Blackness]

○: The L value is 40 or less and blackening is sufficient.

×: The L value exceeds 40 and blackening is insufficient.

[Description of Ion Elution Test]

The obtained pellicle frames were each put into a polyethylene bag and the bag was sealed after 100 ml of pure water was added thereto. Then, the pellicle frame was immersed therein for 4 hours while the temperature was kept at 80° C. Extraction water thus obtained in which components eluted from the pellicle frame were extracted was analyzed with an ion chromatographic analysis device (ICS-2000 manufactured by Dionex Corporation) under the conditions of a cell temperature of 35° C., a column (Ion Pac AS11-HC) temperature of 40° C., and 1.5 ml/min. An acetate ion, a formate ion, a chlorine ion, a nitrite ion, a nitrate ion, a sulfate ion, an oxalate ion, and a phosphonate ion were detected from the extraction water, and the concentrations of those ions to be eluted in 100 ml of pure water per 100 $cm^2$ of the surface area of the support frame were determined.

○: The case where the elution amounts of an acetate ion, a formate ion, a chlorine ion, a nitrite ion, a nitrate ion, a sulfate ion, an oxalate ion, and a phosphate ion are 0.2 ppm or less, 0.06 ppm or less, 0.02 ppm or less, 0.02 ppm or less, 0.02 ppm or less, 0.01 ppm or less, 0.01 ppm or less, and 0.01 ppm or less, respectively.

×: The case where the elution amounts exceed limit values in the item ○.

Test Examples 1-9 to 1-16

Pellicle frames according to Test Examples 1-9 to 1-16 were obtained in the same manner as in Test Examples 1-1 to 1-8 except that an acid aqueous solution (pH=1) in which maleic acid was dissolved was used as the anodic oxidation solution in the second step, and after the anodic oxidation treatment using maleic acid, anodic oxidation treatment (anodic oxidation treatment in the third step) using, as an anodic oxidation solution, an alkaline aqueous solution (pH=13) in which NaOH was dissolved was further performed. For the obtained pellicle frames, the results of the glittering, blackness, and elution test of various ions are shown in Table 1.

Test Examples 1-17 to 1-22

Pellicle frames according to Test Examples 1-17 to 1-22 were obtained in the same manner as in Test Examples 1-1 to 1-8 except that the anodic oxidation solutions in the first step and in the second step were changed to an acid aqueous solution (pH=1) in which maleic acid was dissolved and an alkaline aqueous solution (pH=13) in which NaOH was dissolved, respectively, and electrolytic deposition treatment was adopted as the coloration method. For the obtained pellicle frames, the results of the glittering, blackness, and elution test of various ions are shown in Table 1.

Test Examples 1-23 to 1-27

Pellicle frames according to Test Examples 1-23 to 1-27 were obtained in the same manner as in Test Examples 1-17 to 1-22 except that the anodic oxidation solution in the first step was changed to an acid aqueous solution (pH=1) in which phosphoric acid was dissolved. For the obtained pellicle frames, the results of the glittering, blackness, and elution test of various ions are shown in Table 1.

Test Examples 1-28 and 1-29

Pellicle frames according to Test Examples 1-28 and 1-29 were obtained in the same manner as in Test Examples 1-18 and 1-25, respectively, except that integral coloration was adopted as the coloration method. For the obtained pellicle frames, the results of the glittering, blackness, and elution test of various ions are shown in Table 1.

Test Examples 1-30 and 1-31

Only anodic oxidation treatment using an alkaline aqueous solution (pH=13) in which NaOH was dissolved was performed, and anodic oxidation treatment using an acid anodic oxidation solution was not performed. In addition, the aluminum frame materials after the anodic oxidation treatment were subjected to one of dyeing treatment with an organic dye performed in Test Example 1-1 and the like, and electrolytic deposition treatment performed in Test Example 1-5 and the like. It should be noted that pellicle frames according to Test Examples 1-30 and 1-31 were obtained in the same manner as in Test Example 1-1 except for the foregoing. For the obtained pellicle frames, the results of the glittering, blackness, and elution test of various ions are shown in Table 1.

Test Examples 2-1 to 2-8

Pellicle frames according to Test Examples 2-1 to 2-8 were obtained in the same manner as in Test Examples 1-1 to 1-8 except that the anodic oxidation solution in the first step was changed to an alkaline aqueous solution (pH=13) in which 10 wt % of sodium citrate dihydrate [(Na$_3$(C$_6$H$_5$O$_7$).2H$_2$O)] and 0.5 wt % of sodiumhydroxide were dissolved. For the obtained pellicle frames, the results of the glittering, blackness, and elution test of various ions are shown in Table 2.

Test Examples 2-9 to 2-16

Pellicle frames according to Test Examples 2-9 to 2-16 were obtained in the same manner as in Test Examples 1-9 to 1-16 except that the anodic oxidation solutions in the first step and in the third step were each changed to an alkaline aqueous solution (pH=13) in which 10 wt % of sodium citrate dihydrate [(Na$_3$ (C$_6$H$_5$O$_7$).2H$_2$O)] and 0.5 wt % of sodium hydroxide were dissolved. For the obtained pellicle frames, the results of the glittering, blackness, and elution test of various ions are shown in Table 2.

Test Examples 2-17 to 2-29

Pellicle frames according to Test Examples 2-17 to 2-29 were obtained in the same manner as in Test Examples 1-17 to 1-29 except that the anodic oxidation solution in the second step was changed to an alkaline aqueous solution (pH=13) in which 10 wt % of sodium citrate dihydrate [$(Na_3(C_6H_5O_7).2H_2O)$] and 0.5 wt % of sodium hydroxide were dissolved. For the obtained pellicle frames, the results of the glittering, blackness, and elution test of various ions are shown in Table 2.

Test Examples 2-30 and 2-31

Pellicle frames according to Test Examples 2-30 and 2-31 were obtained in the same manner as in Test Examples 1-30 and 1-31 except that the anodic oxidation solution in the first step was changed to an alkaline aqueous solution (pH=13) in which 10 wt % of sodium citrate dihydrate [$(Na_3(C_6H_5O_7).2H_2O)$] and 0.5 wt % of sodium hydroxide were dissolved. For the obtained pellicle frames, the results of the glittering, blackness, and elution test of various ions are shown in Table 2.

Test Examples 2-32 and 2-33

Pellicle frames according to Test Examples 2-32 and 2-33 were obtained in the same manner as in Test Examples 1-30 and 1-31 except that the anodic oxidation solution in the first step was changed to an alkaline aqueous solution (pH=13) in which 10 wt % of sodium tartrate dihydrate ($Na_2C_4H_4O_6.2H_2O$) and 0.5 wt % of sodium hydroxide were dissolved. For the obtained pellicle frames, the results of the glittering, blackness, and elution test of various ions are shown in Table 2.

Test Examples 2-34 to 2-37

Anodic oxidation treatment using an acid aqueous solution (pH=1) in which phosphoric acid was dissolved or an acid aqueous solution (pH=1) in which oxalic acid was dissolved was performed, and anodic oxidation treatment other than the above was not performed. In addition, the aluminum frame materials after the anodic oxidation treatment were subjected to one of dyeing treatment with an organic dye and electrolytic deposition treatment. It should be noted that pellicle frames according to Test Examples 2-34 to 2-37 were obtained in the same manner as in Test Example 1-1 except for the foregoing. For the obtained pellicle frames, the results of the glittering, blackness, and elution test of various ions are shown in Table 2.

As is apparent from the results, it was confirmed that, in each case of forming the anodic oxide films by using the acid and alkaline anodic oxidation solutions, the glittering defect was not observed, and a pellicle frame excellent in blackness was obtained. In addition, the quantitative limit (lower limit) of the ion chromatographic analysis device used in the test was 0.005 ppm, and the above-mentioned ions were not detected.

TABLE 2

| | Anodic oxidation treatment in first step | | | | | Anodic oxidation treatment in second step | | | | | Anodic oxidation treatment in third step | | | | | Outer appearance | | Elution test | Remark |
|---|---|---|---|---|---|---|---|---|---|---|---|---|---|---|---|---|---|---|---|
| | Electrolytic solution | Concentration (wt %) | Solution temperature (° C.) | Voltage (V) | Time (min) | Electrolytic solution | Concentration (wt %) | Solution temperature (° C.) | Voltage (V) | Time (min) | Electrolytic solution | Concentration (wt %) | Solution temperature (° C.) | Voltage (V) | Time (min) | Coloration method | Glittering | Blackness | | |
| Test Example 2-1 | Na citrate + NaOH | 10 | 10 | 20 | 30 | Phosphoric acid | 5 | 5 | 20 | 5 | | | | | | Dyeing | ○ | ○ | ○ | Corresponding to Example |
| Test Example 2-2 | | | | | | | 5 | 25 | 20 | 5 | | | | | | | ○ | ○ | ○ | Corresponding to Example |
| Test Example 2-3 | | | | | | | 5 | 25 | 20 | 10 | | | | | | | ○ | ○ | ○ | Corresponding to Example |
| Test Example 2-4 | | | | | | | 10 | 25 | 20 | 10 | | | | | | | ○ | ○ | ○ | Corresponding to Example |
| Test Example 2-5 | | | | | | | 5 | 5 | 20 | 5 | | | | | | Electrolytic coloration | ○ | ○ | ○ | Corresponding to Example |
| Test Example 2-6 | | | | | | | 5 | 25 | 20 | 5 | | | | | | | ○ | ○ | ○ | Corresponding to Example |
| Test Example 2-7 | | | | | | | 5 | 25 | 20 | 10 | | | | | | | ○ | ○ | ○ | Corresponding to Example |
| Test Example 2-8 | | | | | | | 10 | 25 | 20 | 10 | | | | | | | ○ | ○ | ○ | Corresponding to Example |
| Test Example 2-9 | Na citrate + NaOH | 10 | 10 | 20 | 30 | Maleic acid | 5 | 25 | 50 | 5 | Na citrate + NaOH | 10 | 10 | 20 | 3 | Dyeing | ○ | ○ | ○ | Corresponding to Example |
| Test Example 2-10 | | | | | | | 5 | 50 | 50 | 5 | | | | | | | ○ | ○ | ○ | Corresponding to Example |
| Test Example 2-11 | | | | | | | 5 | 90 | 100 | 10 | | | | | | | ○ | ○ | ○ | Corresponding to Example |
| Test Example 2-12 | | | | | | | 5 | 90 | 100 | 10 | | | | | | | ○ | ○ | ○ | Corresponding to Example |
| Test Example 2-13 | | | | | | | 20 | 90 | 100 | 10 | | | | | | | ○ | ○ | ○ | Corresponding to Example |
| Test Example 2-14 | | | | | | | 5 | 25 | 100 | 5 | | | | | | Electrolytic coloration | ○ | ○ | ○ | Corresponding to Example |
| Test Example 2-15 | | | | | | | 5 | 50 | 100 | 5 | | | | | | | ○ | ○ | ○ | Corresponding to Example |
| Test Example 2-16 | | | | | | | 5 | 90 | 100 | 10 | | | | | | | ○ | ○ | ○ | Corresponding to Example |
| Test Example 2-17 | Maleic acid | 10 | 50 | 50 | 10 | | 20 | 90 | 100 | 10 | | | | | | | ○ | ○ | ○ | Corresponding to Example |
| Test Example 2-18 | | 10 | 90 | 50 | 10 | | 10 | 10 | 20 | 5 | | | | | | Electrolytic coloration | ○ | ○ | ○ | Corresponding to Example |
| Test Example 2-19 | | 10 | 90 | 100 | 10 | | 10 | 10 | 20 | 5 | | | | | | | ○ | ○ | ○ | Corresponding to Example |
| Test Example 2-20 | | 20 | 90 | 100 | 10 | | 10 | 10 | 20 | 5 | | | | | | | ○ | ○ | ○ | Corresponding to Example |
| Test Example 2-21 | | 20 | 90 | 100 | 20 | | 10 | 10 | 20 | 5 | | | | | | | ○ | ○ | ○ | Corresponding to Example |

TABLE 2-continued

| | Anodic oxidation treatment in first step | | | | | | Anodic oxidation treatment in second step | | | | | | Anodic oxidation treatment in third step | | | | | | Outer appearance | | Elu- | |
|---|---|---|---|---|---|---|---|---|---|---|---|---|---|---|---|---|---|---|---|---|---|---|
| | Electro- lytic solution | Concen- tration (wt %) | Solution temper- ature (° C.) | Voltage (V) | Time (min) | Electro- lytic solution | Concen- tration (wt %) | Solution temper- ature (° C.) | Voltage (V) | Time (min) | Electro- lytic solution | Concen- tration (wt %) | Solution temper- ature (° C.) | Voltage (V) | Time (min) | Coloration method | Gilt- tering | Black- ness | tion test | Remark |
| Test Example 2-22 | Phosphoric acid | 20 | 90 | 100 | 20 | | 10 | 10 | 20 | 30 | | | | | | | Δ | ○ | ○ | Corresponding to Example |
| Test Example 2-23 | | 5 | 5 | 20 | 5 | Na citrate + NaOH | 10 | 10 | 20 | 5 | | | | | | | ○ | ○ | ○ | Corresponding to Example |
| Test Example 2-24 | | 5 | 25 | 20 | 5 | | 10 | 10 | 20 | 5 | | | | | | | ○ | ○ | ○ | Corresponding to Example |
| Test Example 2-25 | | 5 | 25 | 20 | 10 | | 10 | 10 | 20 | 5 | | | | | | | ○ | ○ | ○ | Corresponding to Example |
| Test Example 2-26 | | 10 | 25 | 20 | 10 | | 10 | 10 | 20 | 5 | | | | | | | ○ | ○ | ○ | Corresponding to Example |
| Test Example 2-27 | | 10 | 25 | 20 | 10 | | 10 | 10 | 20 | 30 | | | | | | | Δ | ○ | ○ | Corresponding to Example |
| Test Example 2-28 | Maleic acid | 10 | 90 | 50 | 10 | Na citrate + NaOH | 10 | 10 | 20 | 5 | | | | | | Integral coloration | ○ | ○ | ○ | Corresponding to Example |
| Test Example 2-29 | Phosphoric acid | 5 | 25 | 20 | 10 | | 10 | 10 | 20 | 5 | | | | | | | ○ | ○ | ○ | Corresponding to Example |
| Test Example 2-30 | Na citrate + NaOH | 10 | 10 | 20 | 30 | | | | | | | | | | | Dyeing | × | ○ | ○ | Corresponding to Comparative Example |
| Test Example 2-31 | | 10 | 10 | 20 | 30 | | | | | | | | | | | Electrolytic coloration | × | ○ | ○ | Corresponding to Comparative Example |
| Test Example 2-32 | Na tartrate + NaOH | 10 | 10 | 20 | 30 | | | | | | | | | | | Dyeing | × | ○ | ○ | Corresponding to Comparative Example |
| Test Example 2-33 | | 10 | 10 | 20 | 30 | | | | | | | | | | | Electrolytic coloration | × | ○ | ○ | Corresponding to Comparative Example |
| Test Example 2-34 | Phosphoric acid | 5 | 25 | 20 | 30 | | | | | | | | | | | Dyeing | ○ | ○ | × | Corresponding to Comparative Example |
| Test Example 2-35 | | 5 | 25 | 20 | 30 | | | | | | | | | | | Electrolytic coloration | ○ | ○ | × | Corresponding to Comparative Example |
| Test Example 2-36 | Oxalic acid | 5 | 30 | 20 | 30 | | | | | | | | | | | Dyeing | ○ | ○ | × | Corresponding to Comparative Example |
| Test Example 2-37 | | 5 | 30 | 20 | 30 | | | | | | | | | | | Electrolytic coloration | ○ | ○ | × | Corresponding to Comparative Example |

[Surface Observation of Pellicle Frame]

Figure 1:
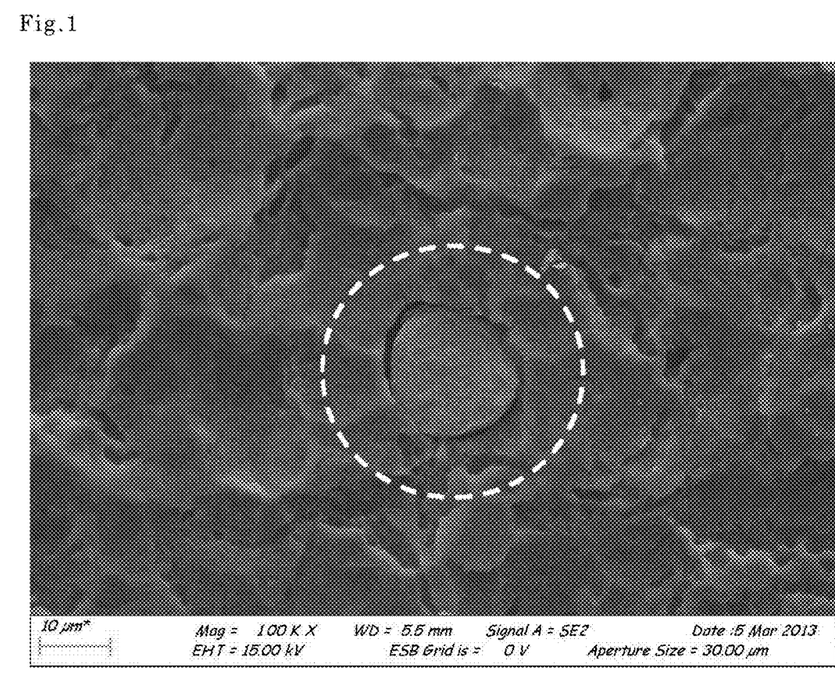
FIG. 1 is a photograph of an intermetallic compound (inside the white dotted line) present on the surface of a pellicle frame according to Test Example 2-30 taken with an electron microscope (SEM).

For the pellicle frame obtained in Test Example 2-30, the surface state of a portion in which glittering had been observed was observed with an electron microscope (SEM) and photographed. Specifically, as a method of specifying the cause for the glittering, the glittering portion was observed with a microscope manufactured by Keyence Corporation, and a mark was formed around the glittering portion, followed by observation of the glittering portion by SEM and component analysis of the glittering portion with an EDAX (manufactured by Horiba, Ltd.). As a result, it was confirmed that the glittering portion was formed of an Al—Fe—Cu-based intermetallic compound. The result is shown in FIG. 1. In addition, the intermetallic compound observed in FIG. 1 (inside the white dotted line) was measured for a maximum length. As a result, it was found that the maximum length was about 22 μm.

[Sectional Observation of Anodic Oxide Film]

For the pellicle frame obtained in Test Example 2-3, the shapes of cross sections of the formed anodic oxide films were observed. First, as pretreatment, the obtained pellicle frame was cut into a small piece and put in an epoxy-based mounting resin, and the resultant sample was polished in a sectional direction after the resin was cured. After that, the cross sections of the anodic oxide films were observed by SEM (FE-SEM S-4500 type manufactured by Hitachi High-Technologies Corporation).

Figure 2:
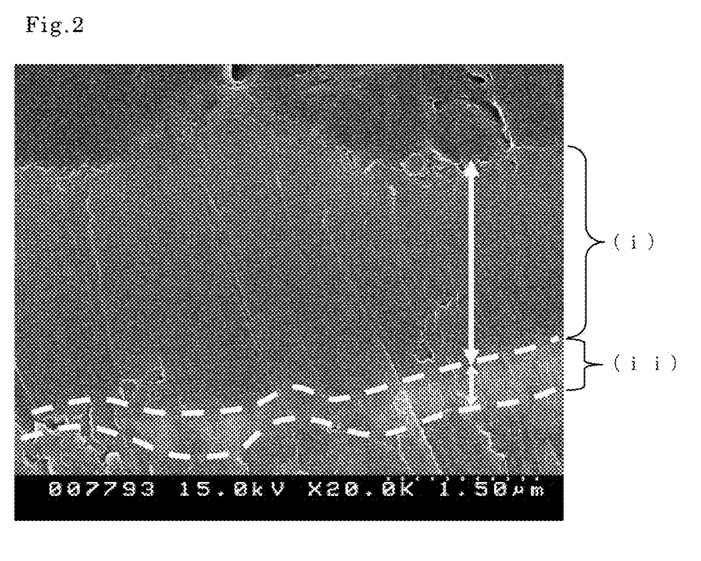
FIG. 2 is a photograph of cross sections of anodic oxide films formed on the surface of a pellicle frame according to Test Example 2-3 taken with an electron microscope (SEM).

The result is shown in FIG. 2.

In FIG. 2, a portion enclosed by the dotted line indicates the anodic oxide film obtained through the anodic oxidation treatment using phosphoric acid, and the anodic oxide film formed by using, as an anodic oxidation solution, Na citrate and sodium hydroxide was laminated thereon.

In addition, also for the pellicle frames obtained in Test Examples 2-18, 2-25, and 1-8, cross sections of the anodic oxide films were observed by the same method as described above. The film thicknesses of the anodic oxide film obtained by using the alkaline anodic oxidation solution and the anodic oxide film obtained by using the acid anodic oxidation solution were measured based on obtained SEM images.

The results are shown in Table 3.

TABLE 3

| Test Example | Anodic oxidation treatment in first step | | Anodic oxidation treatment in second step | | Total film thickness (μm) |
|---|---|---|---|---|---|
| | Electrolytic solution | Film thickness (μm) | Electrolytic solution | Film thickness (μm) | |
| Test Example 2-3 | Na citrate + NaOH | 8.5 | Phosphoric acid | 0.5 | 9 |
| Test Example 2-18 | Maleic acid | 0.5 | Na citrate + NaOH | 2.5 | 3 |
| Test Example 2-25 | Phosphoric acid | 0.5 | Na citrate + NaOH | 2.5 | 3 |
| Test Example 1-8 | NaOH | 7 | Phosphoric acid | 3 | 10 |

INDUSTRIAL APPLICABILITY

The support frame for a pellicle and the pellicle obtained by the present invention can be used in a photolithography step or the like in manufacturing of various semiconductor devices, liquid crystal display devices, and the like. In addition, the surface glittering defect of the pellicle frame falsely recognized as dust is reduced, and hence the support frame for a pellicle and the pellicle can be suitably utilized in the field of manufacturing of a semiconductor device or the like in which thinning increasingly progresses in the future.

The invention claimed is:

1. A pellicle frame, comprising:
   an aluminum frame material formed of aluminum or an aluminum alloy; and
   an anodic oxide film on a surface of the aluminum frame material,
   wherein the anodic oxide film comprises a film formed by using an alkaline anodic oxidation solution and a film formed by using an acid anodic oxidation solution.

2. A pellicle frame according to claim 1, wherein the anodic oxide film is substantially free of an intermetallic compound having a maximum length of 5 μm or more.

3. A pellicle frame according to claim 1, wherein the alkaline anodic oxidation solution comprises an inorganic alkaline solution containing any one or more kinds of inorganic alkaline components selected from the group consisting of sodium hydroxide, potassium hydroxide, lithium hydroxide, calcium hydroxide, strontium hydroxide, rubidium hydroxide, sodium carbonate, and sodium hydrogen carbonate.

4. A pellicle frame according to claim 1, wherein the alkaline anodic oxidation solution comprises an alkaline mixed solution containing any one or more kinds of salts of organic acids selected from the group consisting of tartaric acid, citric acid, oxalic acid, and salicylic acid and any one or more kinds of inorganic alkaline components selected from the group consisting of sodium hydroxide, potassium hydroxide, lithium hydroxide, calcium hydroxide, strontium hydroxide, rubidium hydroxide, sodium carbonate, and sodium hydrogen carbonate.

5. A pellicle frame according to claim 1, wherein the acid anodic oxidation solution comprises an acid solution containing any one or more kinds selected from the group consisting of maleic acid, phosphoric acid, oxalic acid, and chromic acid.

6. A pellicle frame according to claim 1, wherein the aluminum or aluminum alloy comprises an Al—Zn—Mg-based aluminum alloy.

7. A pellicle frame according to claim 1, wherein the anodic oxide film is blackened through dyeing treatment with a black dye or electrolytic deposition treatment so as to have a lightness index $L^*$ value of 40 or less.

8. A pellicle frame according to claim 1, wherein the pellicle frame has concentrations of ions to be eluted in 100 ml of pure water per 100 $cm^2$ of a surface area of the pellicle frame in an ion elution test for measuring concentrations of ions eluted after immersion in pure water at 80° C. for 4 hours of: 0.2 ppm or less for an acetate ion; 0.06 ppm or less for a formate ion; 0.01 ppm or less for an oxalate ion; 0.01 ppm or less for a sulfate ion; 0.02 ppm or less for a nitrate ion; 0.02 ppm or less for a nitrite ion; 0.02 ppm or less for a chlorine ion; and 0.01 ppm or less for a phosphate ion.

9. A method of manufacturing a pellicle frame comprising: an aluminum frame material formed of aluminum or an aluminum alloy; and an anodic oxide film on a surface of the aluminum frame material,
   the method comprising the steps of, when forming the anodic oxide film:
   perfoiining anodic oxidation treatment using an alkaline anodic oxidation solution; and
   performing anodic oxidation treatment using an acid anodic oxidation solution.

10. A method of manufacturing a pellicle frame according to claim 9, wherein the anodic oxide film is substantially free of an intermetallic compound having a maximum length of 5 μm or more.

11. A method of manufacturing a pellicle frame according to claim 9, wherein the alkaline anodic oxidation solution comprises an inorganic alkaline solution containing any one or more kinds of inorganic alkaline components selected from the group consisting of sodium hydroxide, potassium hydroxide, lithium hydroxide, calcium hydroxide, strontium hydroxide, rubidium hydroxide, sodium carbonate, and sodium hydrogen carbonate.

12. A method of manufacturing a pellicle frame according to claim 9, wherein the alkaline anodic oxidation solution comprises an alkaline mixed solution containing any one or more kinds of salts of organic acids selected from the group consisting of tartaric acid, citric acid, oxalic acid, and salicylic acid and any one or more kinds of inorganic alkaline components selected from the group consisting of sodium hydroxide, potassium hydroxide, lithium hydroxide, calcium hydroxide, strontium hydroxide, rubidium hydroxide, sodium carbonate, and sodium hydrogen carbonate.

13. A method of manufacturing a pellicle frame according to claim 9, wherein the acid anodic oxidation solution comprises an acid solution containing any one or more kinds selected from the group consisting of maleic acid, phosphoric acid, oxalic acid, and chromic acid.

14. A method of manufacturing a pellicle frame according to claim 9, wherein the aluminum or aluminum alloy comprises an Al—Zn—Mg-based aluminum alloy.

15. A method of manufacturing a pellicle frame according to claim 9, the method further comprising blackening the anodic oxide film through dyeing treatment with a black dye or electrolytic deposition treatment so as to have a lightness index L* value of 40 or less.

16. A method of manufacturing a pellicle frame according to claim 9, wherein the pellicle frame has concentrations of ions to be eluted in 100 ml of pure water per 100 cm$^2$ of a surface area of the pellicle frame in an ion elution test for measuring concentrations of ions eluted after immersion in pure water at 80° C. for 4 hours of: 0.2 ppm or less for an acetate ion; 0.06 ppm or less for a formate ion; 0.01 ppm or less for an oxalate ion; 0.01 ppm or less for a sulfate ion; 0.02 ppm or less for a nitrate ion; 0.02 ppm or less for a nitrite ion; 0.02 ppm or less for a chlorine ion; and 0.01 ppm or less for a phosphate ion.

* * * * *